United States Patent
Gutman et al.

(10) Patent No.: US 10,897,566 B2
(45) Date of Patent: Jan. 19, 2021

(54) DIRECT FOCUSING WITH IMAGE BINNING IN METROLOGY TOOLS

(71) Applicant: KLA-Tencor Corporation, Milpitas, CA (US)

(72) Inventors: Nadav Gutman, Zichron Ya'aqov (IL); Boris Golovanevsky, Haifa (IL); Noam Gluzer, Rishon Lezion (IL)

(73) Assignee: KLA-Tencor Corporation, Milpitas, CA (US)

( * ) Notice: Subject to any disclaimer, the term of this patent is extended or adjusted under 35 U.S.C. 154(b) by 107 days.

(21) Appl. No.: 15/562,556

(22) PCT Filed: Aug. 25, 2017

(86) PCT No.: PCT/US2017/048746
§ 371 (c)(1),
(2) Date: Sep. 28, 2017

(87) PCT Pub. No.: WO2018/063625
PCT Pub. Date: Apr. 5, 2018

(65) Prior Publication Data
US 2019/0208108 A1     Jul. 4, 2019

Related U.S. Application Data

(60) Provisional application No. 62/400,966, filed on Sep. 28, 2016.

(51) Int. Cl.
*B29C 64/20*     (2017.01)
*B29C 64/30*     (2017.01)
(Continued)

(52) U.S. Cl.
CPC ..... *H04N 5/23212* (2013.01); *G02B 21/0016* (2013.01); *G02B 21/244* (2013.01);
(Continued)

(58) Field of Classification Search
CPC ............ H04N 5/23212; G03F 7/70641; G02B 21/244; G02B 21/0016
(Continued)

(56) References Cited

U.S. PATENT DOCUMENTS

| | | | |
|---|---|---|---|
| 4,672,188 A | 6/1987 | Cohen | |
| 4,931,603 A | 6/1990 | Castonguay et al. | |

(Continued)

FOREIGN PATENT DOCUMENTS

| | | |
|---|---|---|
| JP | 2015022058 A | 2/2015 |
| WO | 2016086056 A1 | 6/2016 |

OTHER PUBLICATIONS

ISA/KR, International Search Report for PCT/US2017/048746 dated Dec. 5, 2017.

*Primary Examiner* — Albert H Cutler
(74) *Attorney, Agent, or Firm* — Hodgson Russ LLP

(57) ABSTRACT

Focusing methods and modules are provided for metrology tools and systems. Methods comprise capturing image(s) of at least two layers of a ROI in an imaging target, binning the captured image(s), deriving a focus shift from the binned captured image(s) by comparing the layers, and calculating a focus position from the derived focus shift. Disclosed methods are direct, may be carried out in parallel to a part of the overlay measurement process and provide fast and simple focus measurements that improve metrology performance.

16 Claims, 7 Drawing Sheets

| (51) | Int. Cl. | |
|---|---|---|
| | B29C 64/393 | (2017.01) |
| | B29C 64/268 | (2017.01) |
| | B29C 64/386 | (2017.01) |
| | B33Y 10/00 | (2015.01) |
| | B33Y 50/02 | (2015.01) |
| | B33Y 30/00 | (2015.01) |
| | B33Y 40/00 | (2020.01) |
| | B29C 64/153 | (2017.01) |
| | B22F 3/105 | (2006.01) |
| | B22F 3/00 | (2006.01) |
| | B29C 64/295 | (2017.01) |
| | B29C 64/264 | (2017.01) |
| | H04N 5/232 | (2006.01) |
| | G02B 21/00 | (2006.01) |
| | G02B 21/24 | (2006.01) |
| | G02B 21/36 | (2006.01) |
| | G03B 13/36 | (2006.01) |
| | G03F 7/20 | (2006.01) |

(52) U.S. Cl.
CPC ........... *G02B 21/245* (2013.01); *G02B 21/36* (2013.01); *G03B 13/36* (2013.01); *G03F 7/20* (2013.01); *G03F 7/70641* (2013.01)

(58) Field of Classification Search
USPC .................................. 348/135–137, 345–350
See application file for complete search history.

(56) References Cited

U.S. PATENT DOCUMENTS

| 6,781,103 | B1 | 8/2004 | Lane et al. |
|---|---|---|---|
| 6,884,552 | B2* | 4/2005 | Mieher ............... G03F 7/70641 356/401 |
| 8,045,786 | B2 | 10/2011 | Widmann et al. |
| 9,316,926 | B2 | 4/2016 | Van Zwet et al. |
| 9,594,299 | B2* | 3/2017 | Hinnen ..................... G03F 1/44 |
| 2006/0062484 | A1 | 3/2006 | Aas et al. |
| 2008/0018874 | A1* | 1/2008 | Dusa ................... G03F 7/70516 355/55 |
| 2008/0244228 | A1* | 10/2008 | Overdick ............. H04N 3/1562 712/39 |
| 2008/0266440 | A1* | 10/2008 | Yazdanfar ............ G02B 21/244 348/340 |
| 2010/0066849 | A1 | 3/2010 | Lim et al. |
| 2013/0035888 | A1 | 2/2013 | Kandel et al. |
| 2013/0063651 | A1 | 3/2013 | Yoshioka et al. |
| 2013/0250162 | A1 | 9/2013 | Sasaki |
| 2013/0336572 | A1* | 12/2013 | Choi ...................... G06T 7/0004 382/144 |
| 2014/0036243 | A1 | 2/2014 | Beyer et al. |
| 2014/0064445 | A1* | 3/2014 | Adler ........................ G21K 7/00 378/43 |
| 2014/0141536 | A1* | 5/2014 | Levinski ............. G03F 7/70641 438/5 |
| 2015/0070550 | A1* | 3/2015 | Shi ...................... H04N 9/04511 348/303 |
| 2016/0003735 | A1 | 1/2016 | Seligson et al. |
| 2016/0178351 | A1 | 6/2016 | Amit et al. |
| 2016/0353006 | A1* | 12/2016 | Andersen ............. H04N 17/002 |
| 2017/0061601 | A1* | 3/2017 | Bryll ..................... G02B 3/0081 |
| 2017/0219935 | A1* | 8/2017 | Chen ...................... H01L 21/027 |

* cited by examiner

DIRECT FOCUSING WITH IMAGE BINNING IN METROLOGY TOOLS

CROSS REFERENCE TO RELATED APPLICATIONS

This application claims the benefit of U.S. Provisional Patent Application No. 62/400,966 filed on Sep. 28, 2016, which is incorporated herein by reference in its entirety.

BACKGROUND OF THE INVENTION

1. Technical Field

The present invention relates to the field of metrology, and more particularly, to focusing processes in metrology tools.

2. Discussion of Related Art

Metrology measurements are complex and essential in efficient photolithography production. Optimal focus is a prerequisite for accurate measurements, and various system designs provide focus measurements. For example, U.S. Pat. Nos. 4,931,603, 4,672,188 and 6,781,103, which are incorporated herein by reference in its entirety, disclose various methods of focus measurements in metrology systems.

Typical prior art focus procedures include scanning the full range of the focus (~10 μm in the case of semiconductor metrology tools); at each focus position grabbing and transferring the full or partial CCD (charge coupled device) images; and preforming analysis on the full or partial image to find the image contrast and to calculate a focus estimation.

Other prior art focus procedures rely on interferometric microscopes using an equal path objective (Linnik microscope) to measure focus by interferometry, and yet other methods such as knife edge detection utilize coherent laser, a rotating perforated disc and a bi-cell detector to derive a focus signal for calibrating the focus.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising: capturing at least one image of at least two layers of a ROI in an imaging target, binning the at least one captured image, deriving a focus shift from the at least one binned captured image by comparing the at least two layers, and calculating a focus position from the derived focus shift.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
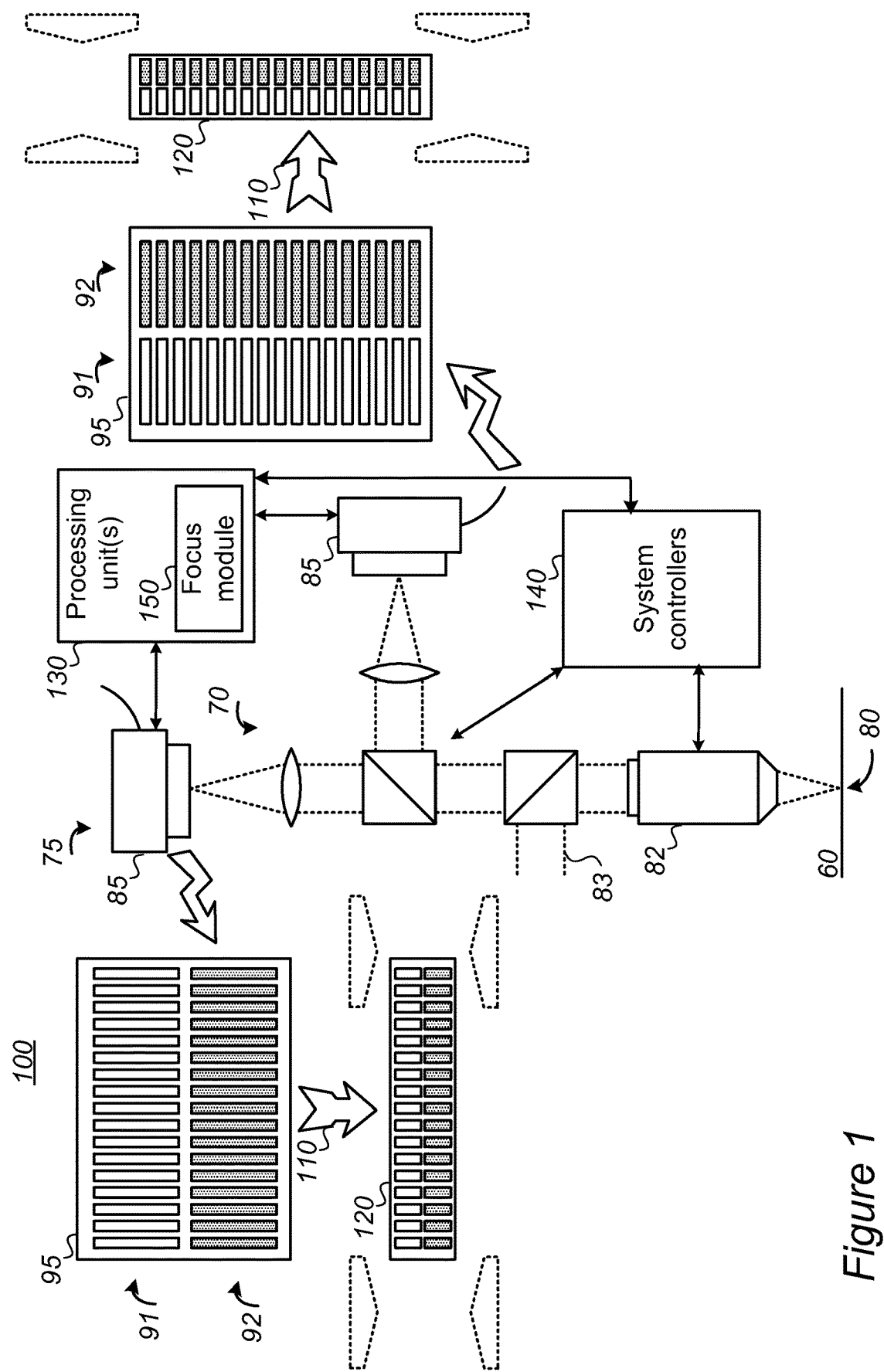
FIG. 1 is a high level schematic block diagram of a metrology system, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention provide efficient and economical methods and mechanisms for focusing in metrology system and thereby provide improvements to the technological field of metrology. Focusing methods and modules are provided for metrology tools and systems. Methods comprise capturing image(s) of at least two layers of a ROI in an imaging target, binning the captured image(s), deriving a focus shift from the binned captured image(s) by comparing the layers, and calculating a focus position from the derived focus shift. Disclosed methods are direct, may be carried out in parallel to a part of the overlay measurement process and provide fast and simple focus measurements that improve metrology performance.

Disclosed systems and methods are configured to find the best focus position for measurement Imaging Based Overlay (IBO) targets such as limited to Advance Imaging Metrology (AIM) targets, as well as for other target types. By directly constricting the contrast functions to predefined Regions of Interest (ROIs), the focusing process is accelerated, simplified, and enable delivering more accurate overlay values, quicker. Advantageously, disclosed systems and methods are faster than slow direct positioning-based system and are simpler and faster than indirect methods using auxiliary technologies such as interferometry and coherent laser chopping.

FIG. 1 is a high level schematic block diagram of a metrology system 100, according to some embodiments of the invention. System 100 comprises a metrology tool 75 comprising an optical arrangement 70 configured to image imaging metrology targets 80 and at least one camera 85 configured to capture images 90 (see FIGS. 4A, 4B for full target images 90) thereof, and a processing unit 130 that comprises a focus module 150. System 100 may be configured to bin 110 at least one captured image 90 of at least two layers 91, 92 of a ROI 95 in imaging target 80 (on a wafer 60), captured by at least one camera 85 of metrology tool 75. Binning 110 may be carried out by processing unit 130 (possibly via focus module 150) and/or by camera(s) 85, possibly in the respective camera hardware.

Binning 110 is shown schematically by the broad, broken-line arrow heads as a transformation from ROI images 95 into respective binned captured images 120, and is explained in detail below. Focus module 150 may be configured to derive a focus shift from at least one binned captured image 120 by comparing at least two layers 91, 92 in the image, and to calculate a focus position from the derived focus shift, as explained below.

Processing unit(s) 130 may be further configured to control system controllers 140 such as motors for moving various elements in optical system 70 (e.g., optical elements, mirrors, an objective 82 thereof, etc.), camera position controllers and so forth. ROI 95 may be one or more parts of full imaging target 90 (see FIGS. 4A, 4B for examples), and may be a small part of full image 90, e.g., possibly be smaller than ⅛ of imaging target 90. Processing unit 130 may be configured to bin images for two orthogonal directions simultaneously, and/or focus module 150 may be configured to derive the focus shift for two orthogonal directions simultaneously, as illustrated schematically in FIG. 1. It is noted that FIG. 1 provides a non-limiting implementation of a two-camera configuration with each camera being dedicated to a measurement direction (X and Y, not shown). It is noted that an additional optical path 83 may be part of optical system 70, possibly configured to enable additional measurements, possibly to further enhance disclosed focus measurements.

In certain embodiments, focusing may be carried out using a single direction, e.g., captured during the alignment (registration) stage. In certain embodiments, using a single direction target with a dedicated camera may create a robust system. For example, capturing by camera 85 the full field of view in a single direction increases the number of pixels per target and the information harvested in that direction, compensating for the reduced exposure time used during binning 110 of pixels. The size of the ROI may also be selected accordingly to optimize the focus calculation accuracy.

In certain embodiments, system 100 may be further configured to carry out at least a part of an overlay calculation during a focus sequence of the capturing, the binning, the deriving and the calculating.

Figure 2A:
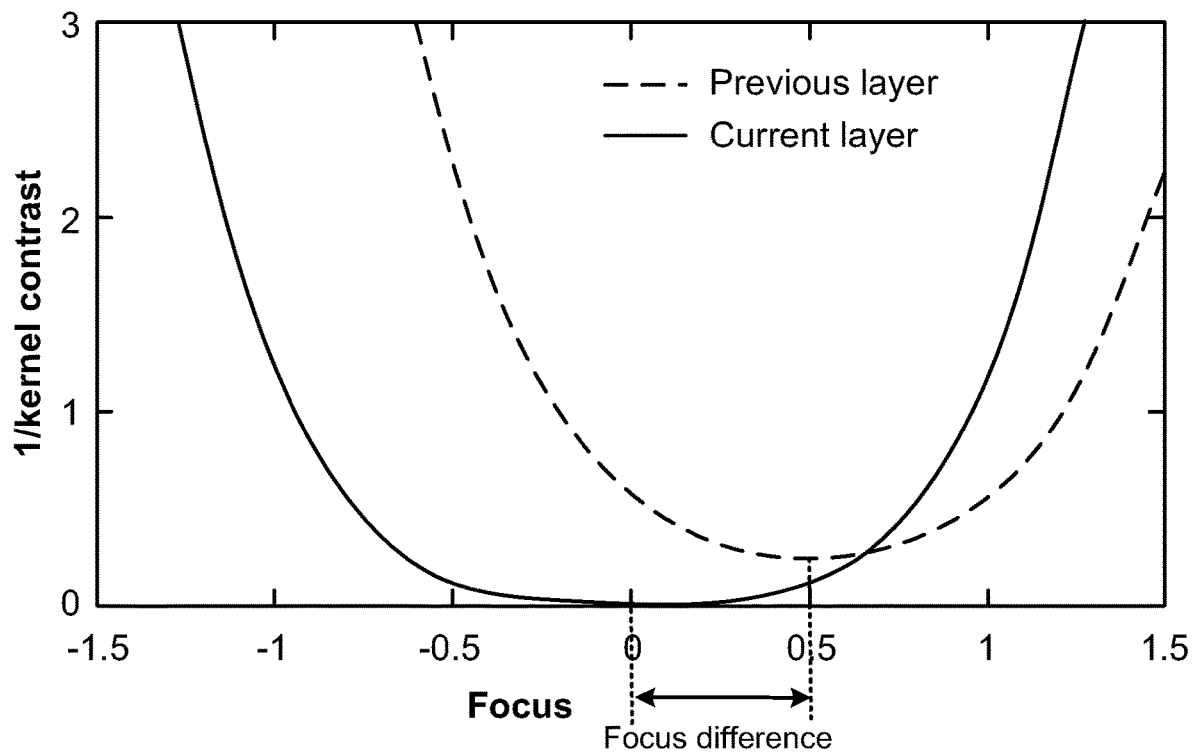
FIGS. 2A and 2B provide a high level schematic illustration of focus shift derivation and focus position calculation, according to some embodiments of the invention.
Figure 2B:
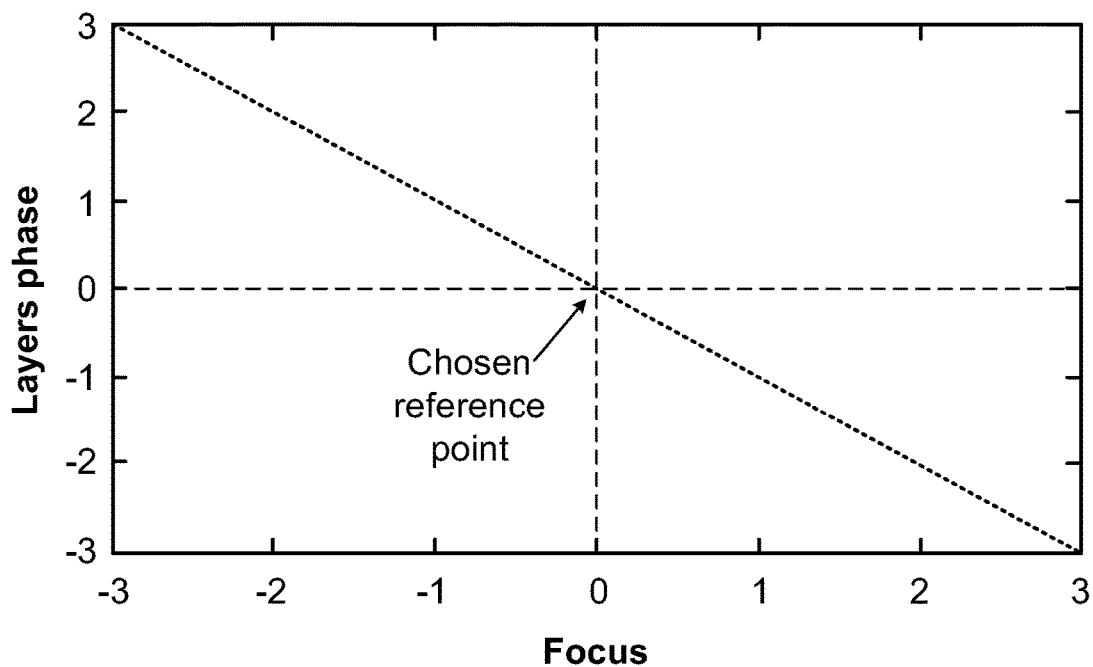

FIGS. 2A and 2B provide a high level schematic illustration of focus shift derivation and focus position calculation, according to some embodiments of the invention. FIG. 2A illustrates an example for contrast functions for layers 91, 92 (e.g., previous and current process layers), which are at different heights within target 80, corresponding to the schematically indicated focus difference between layers 91, 92. It is noted that the lateral translation between respective structures in layers 91, 92 is measured as the overlay between them by metrology tool 75. The contrast functions may be used to calculate the best focus position, e.g., by determining the vertical offset between layers 91, 92 using the focus difference and the parabolic behavior of the focus. As illustrated as a non-limiting example in FIG. 2B, if the contrast function has a more complex curve (not parabolic, see e.g., FIG. 3A) a transformation operator may be used by focus module 150 to create a function out of the inner and outer contrast curves, which is linear with the focus. The required best focus may be set according to the initial and full complex contrast functions. Hence, by minimizing a difference between the linearized function and the preset value of the desired focus value, the required best focus may be determined.

Figure 3A:
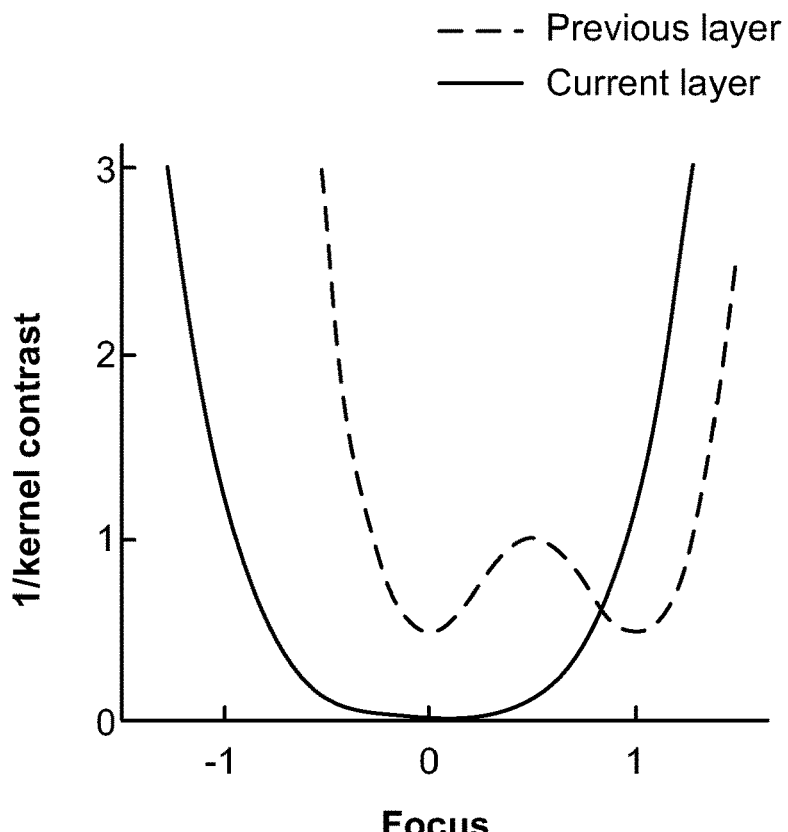
FIGS. 3A and 3B provide additional examples of contrast functions, according to some embodiments of the invention.
Figure 3B:
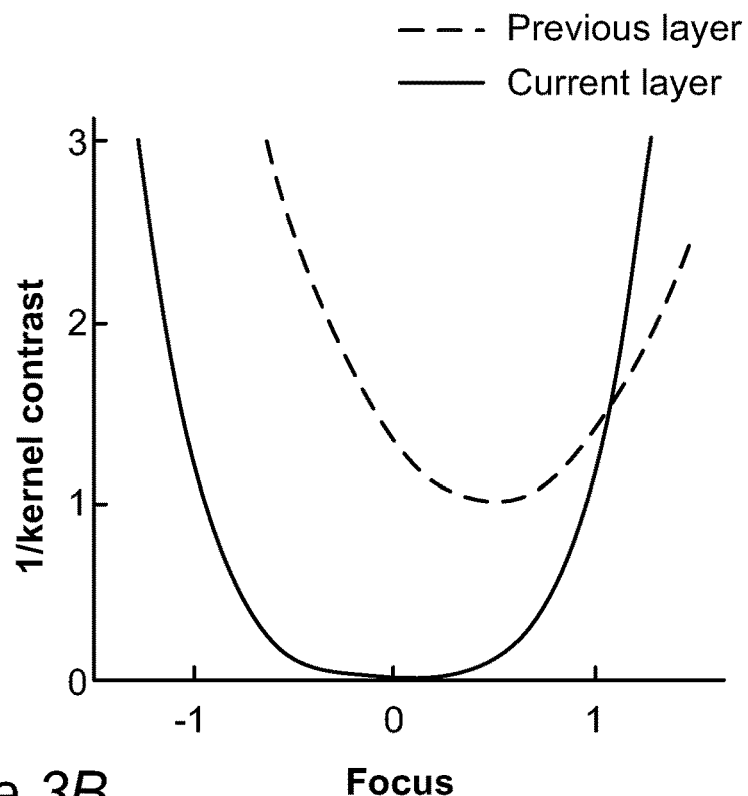

FIGS. 3A and 3B provide additional examples of contrast functions, according to some embodiments of the invention. The illustrated contrast functions do not comply with a parabolic behavior of the focus, and may be processed differently by focus module 150 to yield focus estimations, e.g., by implementing contrast function de-composition algorithms and/or applying non-linear methods.

Figures 4A, 4B:
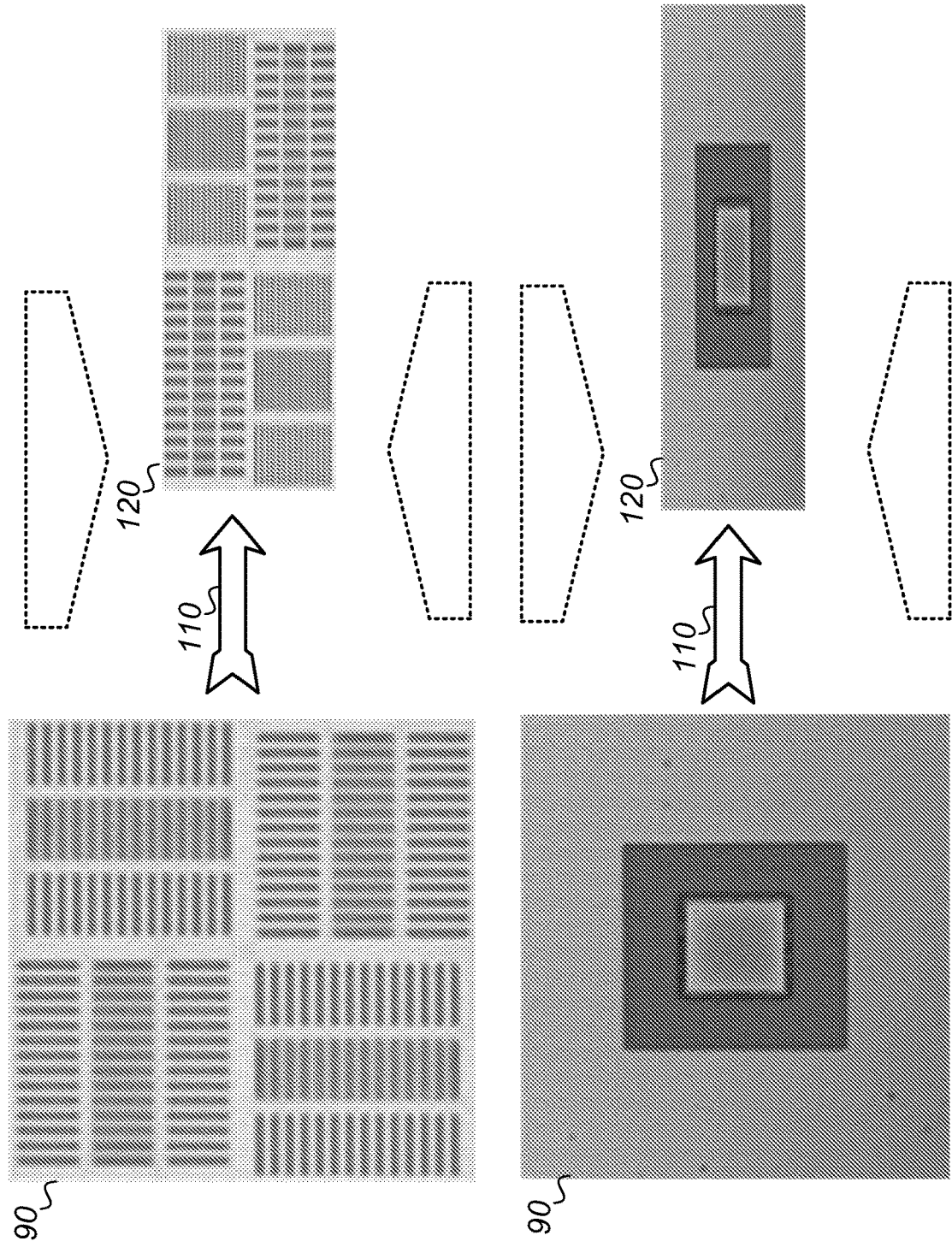
FIGS. 4A and 4B provide examples of image binning, according to some embodiments of the invention.
Figure 4C:
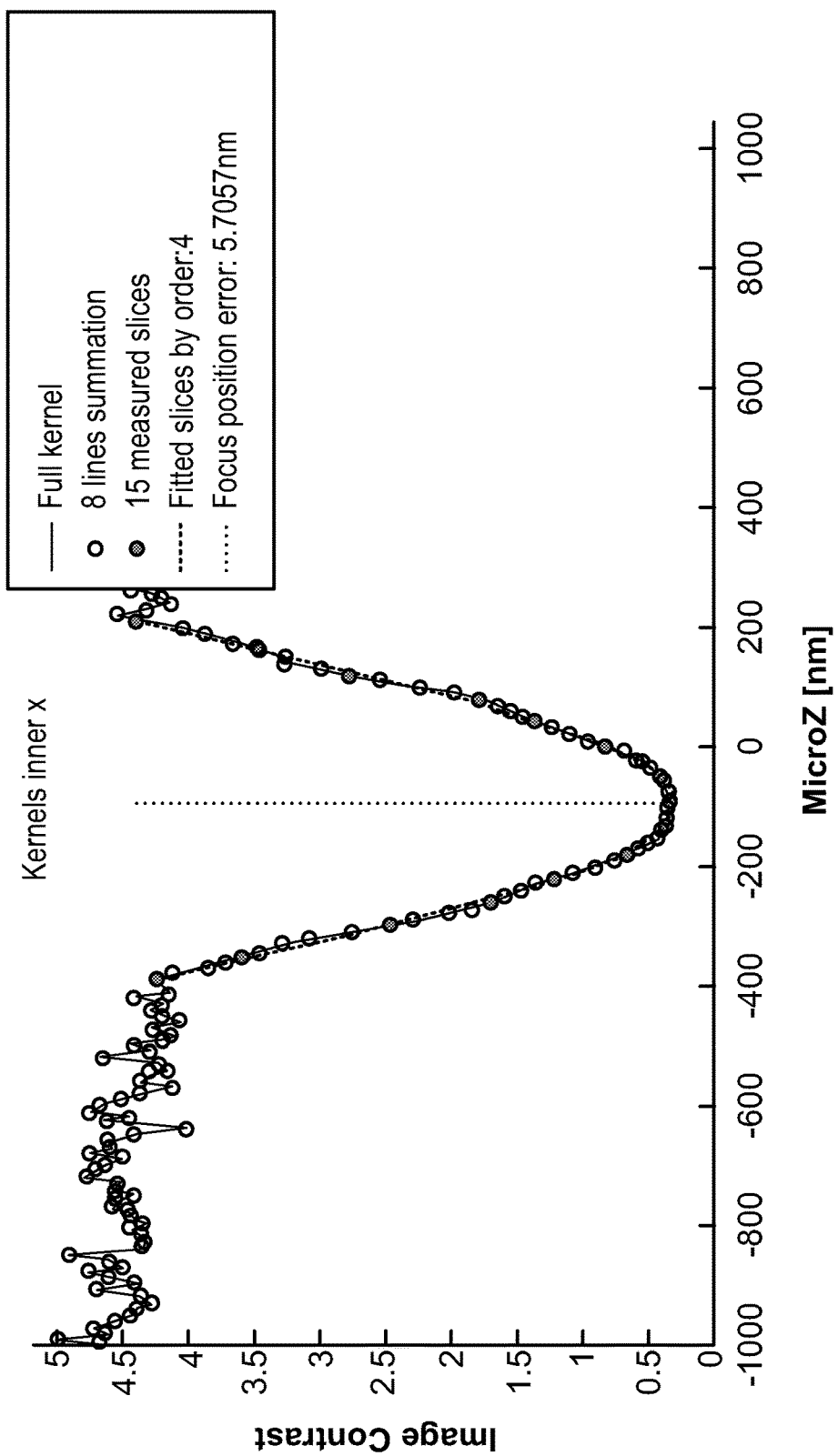
FIG. 4C provides an example showing the preservation of contrast information through a binning procedure, according to some embodiments of the invention.

FIGS. 4A and 4B provide examples of image binning 110, according to some embodiments of the invention. FIGS. 4A and 4B illustrated two examples of imaging targets, AIM (advanced imaging metrology) target 90 and box in box imaging target 90, respectively, as non-limiting examples. The illustration of binning 110 is provided for whole target images as ROIs, as a non-limiting example. Binning 110 may comprise summing up pixels in columns or rows to achieve reduced image sizes of images 120 and increase the image capturing rate (FPS—frames per second), as the FPS is closely propositional to the number of lines use in the binning. The camera exposure intensity may remain the same while the grab time decreases linearly with the number of lines used for binning. In certain embodiments, binning 110 may be carried out within the camera hardware of camera(s) 85, to further reduce processing time. While resulting image 120 is distorted (squashed) with respect to image 90, it contain the exact required information needed for contrast calculation per ROI, as shown above. FIG. 4C provides an example showing the preservation of contrast information through binning procedure 110, according to some embodiments of the invention. As seen in the graph, using eight line summations and using 15 measured slices both provide results which follow closely the focus calculations using full ROI kernels.

It is noted that disclosed methods and system may be used in any image based overlay metrology, and may be used also for scatterometry metrology, using ROI images of scatterometry targets to calculate the focus positions.

Figure 5:
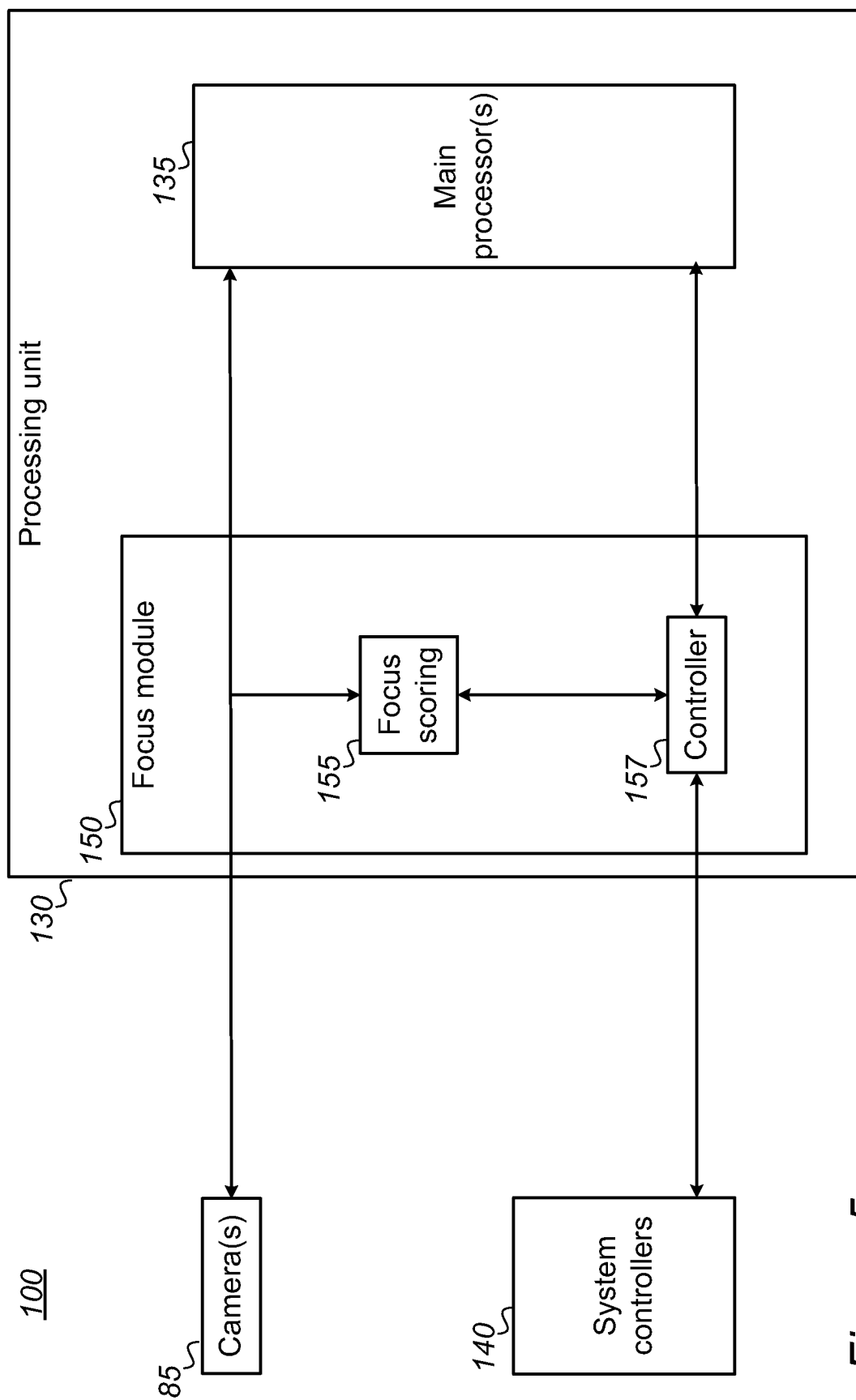
FIG. 5 is a high level schematic block diagram of a part of system, illustrating schematically focus module, according to some embodiments of the invention.

FIG. 5 is a high level schematic block diagram of a part of system 100, illustrating schematically focus module 150, according to some embodiments of the invention. In certain embodiments, processing unit 130 and/or focus module 150 may be at least partly implemented in hardware, e.g., in an FPGA (field-programmable gate array)-based device used for fast calculations, with fast communication (e.g., EtherCAT) for real-time operation. In the illustrated non-limiting example, focus module 150 may be implemented in FPGA with fast communication for real-time operation. Focus module 150 may be connected between camera(s) 85 and a main processor 135 of metrology tool 75 (e.g., a computer) and support various modes in which it may be operable.

For example, during metrology measurements, focus module 150 may be operated in a "sniffer" mode, in which focus module 150 does not interfere in the communication between camera(s) 85 and main processor 135 and is transparent to them. In "sniffer" mode, focus module 150 may be configured to extract data from images captured by metrology tool 75 for other purposes, and perform analysis or diagnostics to improve future focus performance.

During a "fast focus" mode, focus module 150 may be configured to control camera(s) 85 and use captured images 90 for focus calculations as described herein. In "fast focus" mode, focus module 150 may be configured to hijack camera controls to change parameters, e.g., to perform binning 110, and possibly modify parameters of system controllers 140 (e.g., motors, mirrors, etc.) to change actual focus position to the calculated focus position, e.g., via an internal controller 157, operated via a focus scoring sub-module 155. In certain embodiments, focus module 150 may thus be implemented primarily, or even solely, in hardware, for fast performance.

In certain embodiments, captured images 90, captured (grabbed) during the focus sequence, may also be used for calculating a center of symmetry per layer 91, 92, for selecting relevant slices (ROIs) for current and previous layers 91, 92 and/or for calculating the overlay per slice (ROI) and averaging over a range of slices, as well as for any other overlay related calculation. Selecting the focus position may be further optimized by external parameters such as minimum TIS (tool induced shift) or aberration.

In certain embodiments, MAM (move, acquire, measure) time may be reduced by reducing the grab (image capturing) time (e.g., by binning 110, e.g., by a factor of eight in a non-limiting example) and navigation to target 80 may also be improved (e.g., by using information from the focusing process), possibly to reduce the MAM time below 200 ms.

In certain embodiments, noise reduction algorithms may be applied, such as Overlay per Advance Noise Reeducation Algorithm (ANRA), in which the current sequence average over all images is used to reduce the noise and eliminate system errors such as stage drift.

Advantageously, disclosed focusing modules and methods shorten the training sequence significantly; as the train sequence for a new target 80 may comprise only target location and set light for the measurement part, without the prior art need to train for focus offset—due to the direct focus measurements.

Figure 6:
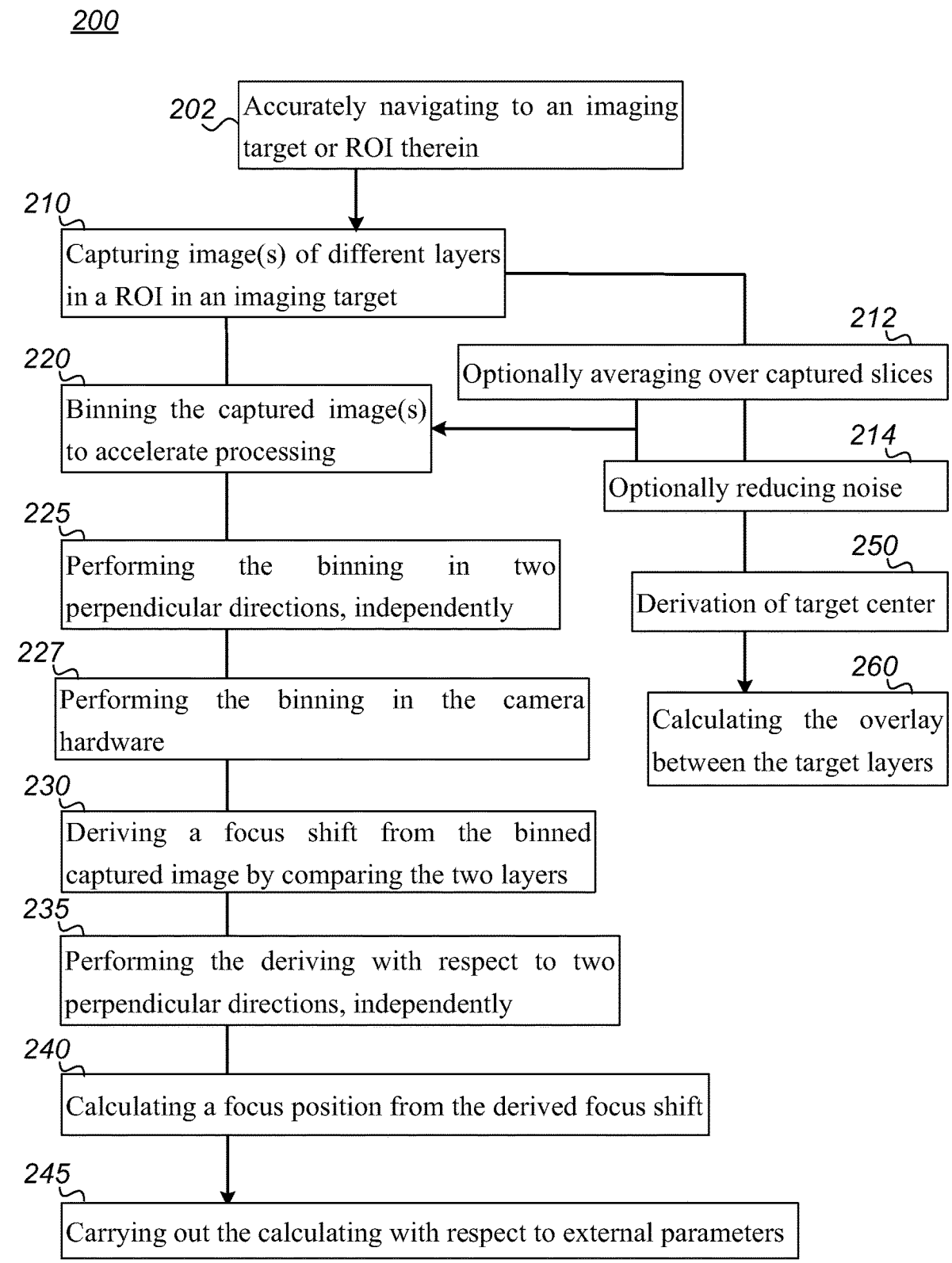
FIG. 6 is a high level flowchart illustrating a method, according to some embodiments of the invention.

FIG. 6 is a high level flowchart illustrating a method 200, according to some embodiments of the invention. The method stages may be carried out with respect to system 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise a focus module in a metrology tool configured to carry out the relevant stages of method 200. Method 200 may comprise the following stages, irrespective of their order.

Method 200 may comprise capturing at least one image of at least two layers of a ROI in an imaging target (stage 210), binning the at least one captured image (stage 220), deriving a focus shift from the at least one binned captured image by comparing the at least two layers (stage 230), and calculating a focus position from the derived focus shift (stage 240).

In certain embodiments, the ROI may be at least one part of the imaging target, e.g., the ROI may have an area that is smaller than ¼ of the imaging target.

In certain embodiments, binning 220 may be carried out for two orthogonal directions simultaneously (stage 225) and/or deriving 230 may be carried out for two orthogonal directions simultaneously (stage 235).

In certain embodiments, binning 220 may be carried out in the camera hardware (stage 227).

In certain embodiments, method 200 may further comprise carrying out calculating 240 with respect to external parameters (stage 245).

In certain embodiments, various image improvement stages and/or various overlay processing stages may be carried out in parallel to the focus calculations, probably contributing to the focus calculation accuracy and/or reducing the overall operation time of the metrology tool. For example, method 200 may further comprise any of: accurately navigating to the imaging target and/or to the respective ROI (stage 202), optionally averaging over captured image slices (stage 212), optionally reducing image or other noise (stage 214) (stages 212, 214 may contribute to binning 220 as well as to overlay calculation), deriving of the target center (stage 250) and/or calculating the overlay between the target layers (stage 260). Method 200 may thus comprise carrying out at least a part of the overlay calculation during the focus sequence of capturing 210, binning 220, deriving 230 and calculating 240.

Advantageously, disclosed systems 100 and methods 200 provide good focus convergence while avoiding full focus range scan to reduce the require focusing time and reduce MAM time. This by nulling the difference between the layer phases, illustrated in FIG. 2B, in one focus jump. Moreover, the direct focusing provides focus positioning without the prior art need to predefine a focus offset using additional or training steps.

Advantageously, calculating the focus position is carried out according to a specific ROI in the metrology target and not according to the full field of view, at every focus site—and disclosed systems 100 and methods 200 therefore achieve shorter focusing time and may be configured to avoid regions in the target that may introduce inaccuracies. Moreover, disclosed systems 100 and methods 200 enable focus adjustment per site, which is required in advance lithograph process nodes because the overlay sensitivity to focus is large enough to hinder the accuracy of the metrology measurement.

Finally, disclosed systems 100 and methods 200 are simpler in construction than prior art systems, do not require application of auxiliary technologies such as laser or interferometry, and therefore improve the optical flatness and cleanness of the metrology tool. Software complexity is also reduced to the measurement essentials with the disclosed direct focus measurement and tracking.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   capturing at least one image of at least two layers of a region of interest (ROI) in an imaging target,
   binning the at least one captured image,
   using a contrast function constrained to the ROI:
      deriving a focus shift from the at least one binned captured image by comparing the at least two layers, and
      calculating a focus position by determining a vertical offset between the at least two layers using the derived focus shift and:
         if a behavior of the contrast function is parabolic, the contrast function, or
         if the behavior of the contrast function is non-parabolic, a complex function created using a transformation operator out of an inner contrast curve and an outer contrast curve of the contrast function.

2. The method of claim 1, wherein the ROI is at least one part of the imaging target.

3. The method of claim 1, wherein the ROI has an area that is smaller than ¼ of the imaging target.

4. The method of claim 1, wherein the deriving is carried out for two orthogonal directions simultaneously.

5. The method of claim 1, wherein the binning is carried out for two orthogonal directions simultaneously.

6. The method of claim 1, wherein the capturing is carried out by at least one camera and the binning is carried out within camera hardware thereof.

7. The method of claim 1, further comprising carrying out at least a part of an overlay calculation during a focus sequence of the capturing, the binning, the deriving and the calculating.

8. The method of claim 1, wherein at least one of the binning, the deriving, and the calculating is carried out by a focus module configured to execute on a processing unit of a metrology tool.

9. A computer program product comprising a non-transitory computer readable storage medium having computer readable program embodied therewith, the computer readable program configured to carry out the binning, the deriving and the calculating of the method of claim 1.

10. A system comprising:
- a metrology tool comprising an optical arrangement configured to image imaging metrology targets and at least one camera configured to capture images thereof,
- wherein the system is configured to bin at least one captured image of at least two layers of a region of interest (ROI) in an imaging target, captured by the at least one camera of the metrology tool, and
- a processing unit that comprises a focus module configured to execute the following steps on the processing unit, using a contrast function constrained to the ROI:
  - derive a focus shift from the at least one binned captured image by comparing the at least two layers, and
  - calculate a focus position by determining a vertical offset between the at least two layers using the derived focus shift and:
    - if a behavior of the contrast function is parabolic, the contrast function, or
    - if the behavior of the contrast function is non-parabolic, a complex function created using a transformation operator out of an inner contrast curve and an outer contrast curve of the contrast function.

11. The system of claim 10, wherein the ROI is at least one part of the imaging target.

12. The system of claim 10, wherein the ROI has an area that is smaller than ¼ of the imaging target.

13. The system of claim 10, wherein the focus module is configured to carry out the deriving for two orthogonal directions simultaneously.

14. The system of claim 10, wherein the processing unit is configured to carry out the binning for two orthogonal directions simultaneously.

15. The system of claim 10, wherein the at least one camera is configured to carry out the binning within respective camera hardware.

16. The system of claim 10, further configured to carry out at least a part of an overlay calculation during a focus sequence of the capturing, the binning, the deriving and the calculating.

* * * * *